United States Patent [19]

Schulz

[11] Patent Number: 4,853,800
[45] Date of Patent: Aug. 1, 1989

[54] METHOD AND CIRCUIT FOR RECORDING BROADBAND SIGNALS ON A MAGNETIC RECORD MEDIUM

[75] Inventor: Axel Schulz, Bickenbach, Fed. Rep. of Germany

[73] Assignee: Robert Bosch GmbH, Stuttgart, Fed. Rep. of Germany

[21] Appl. No.: 121,701

[22] Filed: Nov. 17, 1987

[30] Foreign Application Priority Data

Dec. 11, 1986 [DE] Fed. Rep. of Germany ....... 3642316

[51] Int. Cl.$^4$ .............................................. G11B 5/09
[52] U.S. Cl. ..................................................... 360/46
[58] Field of Search ...................... 360/123, 46, 68, 65

[56] References Cited

U.S. PATENT DOCUMENTS

| | | | |
|---|---|---|---|
| 2,889,541 | 6/1959 | Huss et al. | 360/46 |
| 4,008,493 | 2/1973 | Pizzuro | 360/123 |
| 4,245,268 | 1/1981 | Toshimitsu | 360/123 |
| 4,296,444 | 10/1981 | Sochor . | |

FOREIGN PATENT DOCUMENTS 2735498  2/1979  Fed. Rep. of Germany .

OTHER PUBLICATIONS

Manz, "Videorecorder-Technik", 1st Ed. 1979, pp. 148–153, Sections 6.8 & 6.9, FIGS. 6-18 thru 6-20.

Primary Examiner—Vincent P. Canney
Attorney, Agent, or Firm—Frishauf, Holtz, Goodman & Woodward

[57] ABSTRACT

In order to provide a magnetic recording head with a broadband signal with minimum distortion from the reactances of wire connections and the like, a voltage controlled current source is used to feed equivalent circuits representing a magnetic head like the recording head in an output that is taken from that current source at a point that reflects the effect of the equivalent circuit to operate the controlled voltage source for providing the driving current for the recording head. Instead of a parallel coil and resistor combination in series with another resistor, the equivalent circuit can consist of another magnetic head of the same kind as the recording magnetic head but not used for recording. In practice differential or complementary cascode amplifiers are used for the voltage controlled current source at the signal input and differential or complementary final stage amplifiers are used for driving the recording head through a rotary transformer or broadband recording on tape. When the equivalent circuit is another magnetic head not used for recording, it may be convenient to drive it through a transformer, particularly when the controlled current source for which it provides a load is a differential amplifier.

13 Claims, 3 Drawing Sheets

METHOD AND CIRCUIT FOR RECORDING BROADBAND SIGNALS ON A MAGNETIC RECORD MEDIUM

This invention concerns magnetic recording, particularly on tape, of broadband signals in which electric current carried through the windings of magnetic heads carried on a rotating disk produce the magnetic record.

A recording amplifier for controlling magnetic heads on a rotating head wheel is known from the book by Friedrich Manz, "Video Recorder-Technik", page 151. This amplifier consists of two grounded emitter circuits which are driven in push-pull. Each of the grounded emitter circuits operates as a current source, in each case for an external connection of the fixed coil of a rotary transformer. The center tap of that coil is held at a fixed potential. The rotary transformer has a secondary coil that is connected to the magnetic head. For broadband recording of signals having a frequency band greater than 3.5 MHz this type of amplifier is quite unsuitable.

A circuit in which transistors are connected as emitter followers in an output stage is also known for driving an inductive converter, as shown in DE-OS No. 27 35 498 and U.S. Pat. No. 4,296,444. This output stage is driven through a network which compensates for the conductive components of a magnetic head. This network is not suitable, however, to compensate the inductive components of the magnetic head over a frequency range from 0 to 60 MHz.

SUMMARY OF THE INVENTION

It is an object of the present invention to provide a circuit in which currents of broadband signals, for example up to 60 MHz, can be brought over longer conductor paths to recording heads with very low distortion.

Briefly, a current source is used for this purpose in a cascode differential amplifier circuit. The resulting amplifier is particularly easy to build.

The technical problem of recording broadband signals magnetically is to impress a current of particular and varying magnitude on an electromagnetic transducer such as a magnetic head of a magnetic tape recorder. In the simplest case that is possible by connecting a current source to the inductive load and then to control this current source with a corresponding varying voltage. Accordingly, a voltage controlled current source is used which is driven to supply the video magnetic head with a current that corresponds to the input voltage. This runs into difficulties, however, because a length of conductors is connected between the output of this voltage controlled current source and the video magnetic head. These conductors pervert the effects of the current in the magnetic head as a result of inductive and capacitive effects. The wire capacitances can be regarded as being circuit capacitances which are in parallel to the self-inductance of the video magnetic head. The current provided by the voltage controlled current source accordingly does not flow entirely through the magnetic head. In addition, there are problems involved in matching a current source output to a frequency dependent resistance of a magnetic head which is connected to the current source output over conductors of a length that is not negligible.

According to the invention, therefore, the problem is to generate a voltage representative of a signal extending over a large frequency range (about 0 to 60 mHz) which voltage will result in the flow of a current in the winding of the magnetic head that corresponds to the input voltage.

According to the invention, by means of a current source and an equivalent circuit of the magnetic head, a current is generated proportional to an input voltage and then with a resetting voltage a current source is controlled through the equivalent circuit.

In terms of circuits this means that a current should be allowed to flow in an equivalent circuit which corresponds to the flow current in the winding of the magnetic head on the rotating disk. A voltage drop produced through this equivalent circuit serves for controlling the voltage controlled current source for feeding the actual magnetic head.

BRIEF DESCRIPTION OF THE DRAWINGS

The invention is further described by way of illustrative example with reference to the annexed drawings in which.

DESCRIPTION OF THE ILLUSTRATED PRINCIPLES AND EMBODIMENTS

Figure 1:
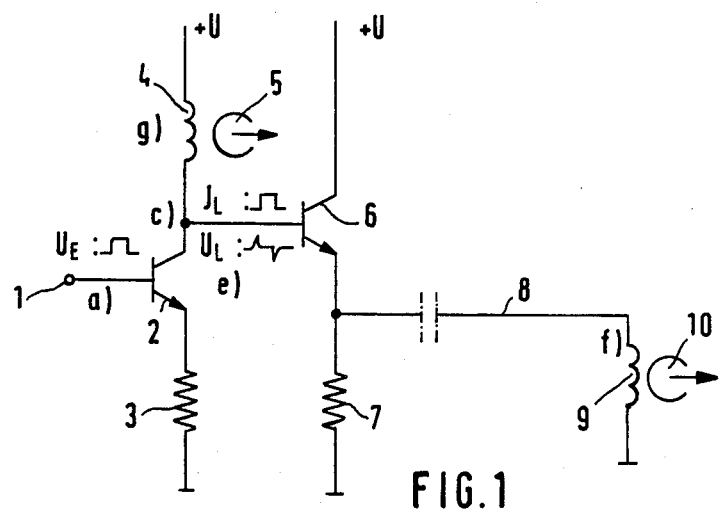
FIG. 1 is a basic circuit diagram of the apparatus for practicing the invention.

FIG. 1 is a circuit diagram for the configuration which is basic to embodiments of this invention.

A signal voltage source is connected to the input 1 of the basic circuit. This signal voltage source produces a meander-shaped voltage $U_E$ which is applied to the base of a first transistor 2. The emitter of the transistor 2 is connected to a fixed potential through the emitter resistance 3. The winding 4 of a video magnetic head, wound on the core 5, is connected between the voltage supply $+U$ in the collector of the transistor 2. The base of a second transistor 6 is connected also to the collector of the transistor 2. The collector of the transistor 6 is connected directly to the supply voltage $+U$ and its emitter is connected to fixed potential over an emitter resistance 7. The transistor 6 operates as an emitter follower and serves for impedance conversion. The winding 9 of a second magnetic head used for recording on magnetic tape is connected to the emitter of the transistor 6 over a conductor 8. The second connection of the winding 9 connects with fixed potential. The winding 9 has a core 10.

The voltage $U_E$ causes a current I to flow in the winding 4 connected to the collector of the first transistor 2. This current has the same form as the voltage $U_E$ at the input 1. The voltage $U_L$, which is established at the connection of the magnetic head 4, 5, has a different course: it consists of differentiated "spikes". The voltage $U_L$ generates a current $I_L$ in the transistor stage 6 which is connected to the output of the current source consisting of the transistor 2. The current $I_L$ is proportional to the input voltage $U_E$. The video magnetic head 4, 5 at the output of the voltage controlled current source 2 can be designated as an equivalent circuit for the magnetic head. The equivalent circuit can also be constituted by other passive circuit components in order to correspond to the actual video magnetic head. It has been found in practice, however, that it is actually better in many cases to utilize a video magnetic head just like the one used on the head wheel disk for recording of the signals. This is to be recommended for the reason, among others, that the ferrite of a magnetic head core has characteristic values that are dependent on frequency, so that an equivalent circuit utilizing other components can be constituted only with the greatest difficulty. In practice it is sufficient for this video magnetic head providing the equivalent circuit to correspond more or less in its characteristics to the specification data for one of the magnetic heads to be used for recording. A magnetic head can therefore be utilized which is a reject because of dimensions exceeding merely mechanical tolerances.

Figure 2:
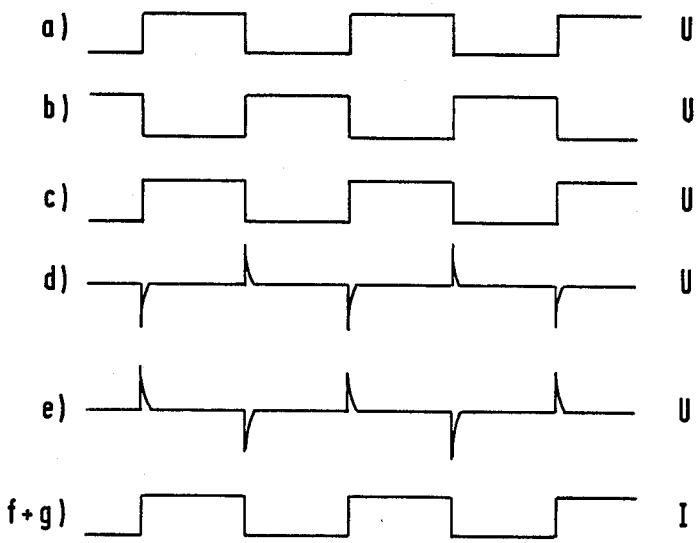
FIG. 2a through $f+g$ is a set of graphs drawn to a common time scale showing the wave shape of current and voltage waves appearing in various portions of the circuit of FIG. 1.

The curve (a) of FIG. 2 corresponds to the course of the input voltage $U_E$ in which a voltage corresponding to the curve (e) of FIG. 2 is produced in the first transistor stage connected to the equivalent circuit 4, 5. This voltage shown in the curve (e) of FIG. 2 corresponds to a current (f) which is driven through the equivalent circuit and thereby also through the transistor stage 6. In the recording magnetic head 9, 10 connected through the line 8, a current is generated corresponding to curve (g) of FIG. 2, which corresponds exactly to the current (f) of FIG. 2 flowing in the equivalent circuit.

In the case of a matched load, the internal resistance of the generator should correspond to the impedance of the line. The line should be terminated at its other end with a terminal resistance of corresponding magnitude. In the use of a current source as a generator with nearly infinite resistance exact matching of a load is not possible. Since the impedance of the magnetic head is dependent upon frequency, exact termination of the line is impossible. In the case of a mismatch, reflections are produced, so that only a distorted current can flow through the winding of a recording magnetic head connected through the current source over a relatively long line.

The above-described difficulties become much less serious when instead of the current source a voltage source is used having an internal resistance of the order of a few ohms. The basic circuit utilizes this advantageous substitution by having the current source connected in tandem to a voltage source.

Figure 3:
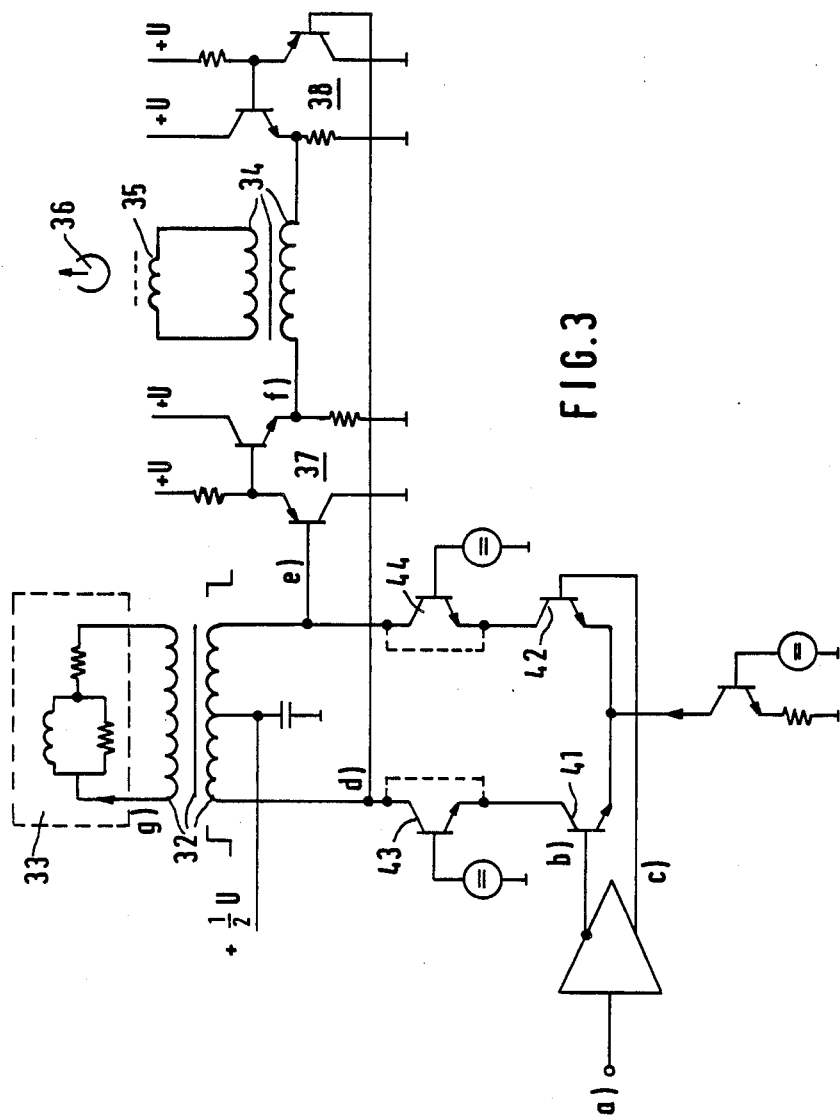
FIG. 3 is a circuit block diagram of a practical embodiment of the circuit and method principle illustrated in FIG. 1.

FIG. 3 shows an embodiment of a circuit for carrying out the method of the invention: A current source of a construction to be described below, feeds the equivalent circuit 33 of the magnetic head through a transformer 32. This equivalent circuit 33 can in practice consist of an actual video magnetic head which is unsuitable for use on the head wheel disk as the result of exceeding tolerances, which would therefore otherwise be discarded as a reject. In the present case it is not the voltage across the equivalent circuit 33 of the magnetic head which is used, but rather the corresponding voltage at the primary side of the transformer 32 interposed between the current source and the equivalent circuit. This is amplified and then supplied through a rotary transformer 34 to a winding 35 of the magnetic head 36 provided for broadband video information recording.

The voltage-controlled current source at the input of the equivalent circuit consists of a differential amplifier in cascode circuit, i.e. a pair of transistors 41 and 42 in common emitter circuit respectively having in their collector circuits additional transistors 43 and 44 in grounded base circuit. The two circuit branches of the differential amplifier in cascode circuit thus drive the transformer 32 in push-pull. On the secondary side of the transformer 32 there is connected the equivalent circuit 33 for the video magnetic head, where a current (FIG. 2, curve (g)) is produced the course of which corresponds to the voltage (FIG. 2, curve (a)) at the input of the circuit.

When the input voltage has a meander-shaped rectangular form, a current of corresponding form will then flow through the winding of the magnetic head. The voltage which is established through the connections of the equivalent cicuit 33 of the video magnetic head is transformed to the primary side and then taken off there and supplied to two cascaded emitter followers 37 and 38 for impedance conversion. This circuit controls the fixed coil of the rotary transformer as a voltage controlled current source and thereby has the same effect on the video magnetic head. The cascode circuit used in the embodiment of FIG. 3 in each of the branches of the differential amplifier for realizing a voltage-controlled current source is recommended especially for circuit technology reasons. In both of the input transistors there is an input capacitance to the collector, the so-called Miller capacitance, the effect of which can be reduced with the connection of a cascode circuit. There results then a greater obtainable band width for signal processing.

The equivalent circuit of the video magnetic head, instead of being connected to the secondary side of the transformer, can be connected with the current source, that is, with the collectors of the output transistors of the differential amplifier. For example a video magnetic head can be put between each of the last collectors of the differential amplifier and the supply voltage as an equivalent circuit. Symmetry problems then arise, however, in a practical embodiment of that type, because it is difficult to obtain two video magnetic heads with exactly the same electrical and magnetic properties.

Figure 4:
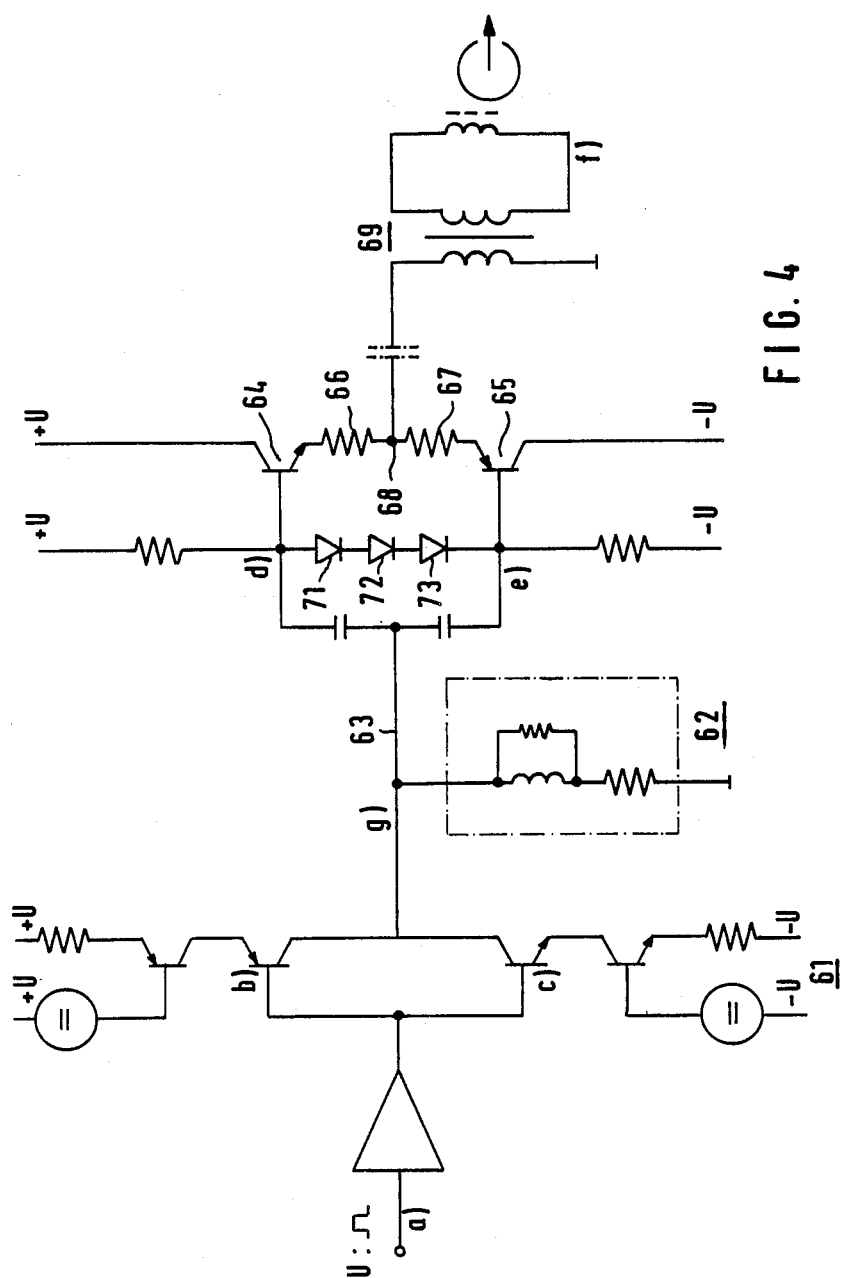
FIG. 4 is a circuit block diagram of a second embodiment of the same circuit and method principle.

In the embodiment of FIG. 4, the current source 61 is made up of two complementary cascodes which feed the equivalent circuit 62 and also feed the transistors 64, 65 through the line 63. These transistors serve as complementary emitter followers for impedance conversion. The resistance 66 and 67 respectively between the emitters of the transistors 64 and 65 and the common connection 68 at the primary side of the rotary transformer 69 determine the current that flows through the transformer and also serve to provide temperature compensation. The diode chain 71, 72, 73 is driven in the conducting direction of the diodes and stabilizes the voltage between the bases of the complementary transistors 64 and 65 of the emitter follower at 2.1 volts and thereby fixes their operating point.

The basic diagram and the two illustrative embodiments all involve the method of the invention, in spite of the differences of the construction of the circuits, namely the use of a current source which feeds an equivalent circuit, for example a video magnetic head, while the voltage that appears across this equivalent circuit is supplied with impedance conversion to a voltage source which then controls the recording video magnetic head.

If the equivalent circuit is to be made otherwise than by the use of a magnetic head structure, it is best composed of a coil in parallel with a first resistor and a second resistor in series with the parallel combination of the coil and the first resistor, as shown in FIG. 3 and FIG. 4.

Although the invention has been described with respect to particular illustrative embodiments, variations and modifications are possible within the inventive concept.

What is claimed is:

1. Method of applying broadband signals to a magnetic recording head with low signal distortion comprising the steps of:
   using a signal voltage to control a current source to produce a corresponding signal current;
   supplying said signal current to another magnetic head of the same general type as the magnetic recording head used for recording, whereby said other magnetic head is utilized as a equivalent circuit corresponding to said magnetic recording head used for recording, and
   using a voltage that appears across said other magnetic head of the same general type as the magnetic recording head used for recording to control a voltage source connected for applying signal to said magnetic head used for recording in order to record signals on a magnetic record medium.

2. Method of applying broadband signals to a magnetic recording head with low signal distortion comprising the steps of:
   using a signal voltage to control a current source to produce a corresponding signal current;
   supplying said signal current to an equivalent circuit corresponding to said magnetic recording head over a frequency bandwidth of the order of 60 MHz and, comprising at least an inductance, a resistance connected in parallel to said inductance and a resistance in series with said inductance and
   using a voltage that appears across said equivalent circuit to control a voltage source connected for applying signals to said magnetic recording head for recording said signals on a magnetic record medium;
   wherein the supplying of said signal current to said equivalent circuit is accomplished through a transformer having a primary winding interposed in said current source and a secondary winding across which said equivalent circuit is connected and wherein the voltage that appears across said equivalent circuit it is transformed by said transformer to produce across said primary winding thereof a voltage for control of a voltage source connected for applying signals to said magnetic recording head.

3. Method as defined in claim 2, wherein signals are applied to said magnetic recording head by said controlled voltage source through a rotary transformer.

4. Apparatus for applying a broadband signal to a winding of a magnetic recording head, comprising:
   a cascode differential amplifier having differential inputs and having differential outputs connected for application of said signal differentially to its inptus;
   an equivalent circuit representing a magnetic head like said recording head and connected for providing a load for current flowing between said differential outputs of said cascode differential amplifier;
   a second differential amplifier having differential inputs respectively connected to said differential outputs of said cascode differential amplifier, and
   a magnetic recording head having a winding connected so as to provide a load for current flowing between said differential outputs of said second differential amplifier.

5. Apparatus as defined in claim 4, wherein said equivalent circuit is composed of a parallel combination of a coil and a first resistance and a second resistance which is in series with said parallel combination, said equivalent circuit being connected for providing a load for current flowing between said differential outputs of said cascode differential amplifier.

6. Apparatus as defined in claim 5, wherein the connection of said equivalent circuit and said differential outputs of said cascode differential amplifier is made through a transformer.

7. Apparatus as defined in claim 4, wherein said equivalent circuit is constituted by the wind of an actual magnetic head like said recording head, but not mounted for recording.

8. Apparatus as defined in claim 5, wherein the connection of said equivalent circuit and said differential outputs of said cascode differential amplifier is made through a transformer.

9. Apparatus for applying a broadband signal to a winding of a magnetic recording head, comprising:
   complementary current source constituted of complementary cascode circuits having an output at the junction of said complementary cascode circuits and a signal input connected in parallel to control electrodes of said respective cascode circuits;
   an equivalent circuit representing a magnetic head like said recording head and connected between said output of said complementary current source and a terminal of fixed potential;
   a complementary push-pull final stage having an input connected to said output of said complementary current source to which said equivalent circuit is also connected and having an output connected to a first coil of a rotary transformer, and
   a magnetic recording head connected to a second coil of said rotary transformer.

10. Apparatus as defined in claim 9, wherein said equivalent circuit representing a magnetic head is composed of a parallel combination of a coil and a first resistance and a second resistance which is in series with said parallel combination.

11. Apparatus as defined in claim 9, wherein said equivalent circuit is composed of the winding of an actual magnetic head like said recording head, but is not used for recording.

12. Method as defined in claim 1, wherein the supplying of said signal current to said other magnetic head is accomplished through a transformer having a primary winding connected to said current source and a secondary winding across which said other magnetic head is connected and wherein the voltage that appears across said other magnetic head is transformed by said transformer to produce a voltage applied to control a voltage source connected for applying signals to said magnetic recording head used for recording.

13. Method as defined in claim 12, wherein signals are applied by said voltage source to said magnetic head used for recording through a rotary transformer.

* * * * *